(12) United States Patent
Shiraki et al.

(10) Patent No.: US 10,357,877 B2
(45) Date of Patent: Jul. 23, 2019

(54) INDUSTRIAL ROBOT WITH NOTCH

(71) Applicant: NIDEC SANKYO CORPORATION, Suwa-gun, Nagano (JP)

(72) Inventors: Takahiro Shiraki, Nagano (JP); Yasuyuki Kitahara, Nagano (JP); Tamotsu Kuribayashi, Nagano (JP); Takao Nakae, Nagano (JP); Shigeyuki Kaino, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 0 days.

(21) Appl. No.: 15/521,733

(22) PCT Filed: Jul. 25, 2016

(86) PCT No.: PCT/JP2016/071711
§ 371 (c)(1),
(2) Date: Apr. 25, 2017

(87) PCT Pub. No.: WO2017/026256
PCT Pub. Date: Feb. 16, 2017

(65) Prior Publication Data
US 2018/0141208 A1    May 24, 2018

Related U.S. Application Data (60) Provisional application No. 62/202,450, filed on Aug. 7, 2015.

(30) Foreign Application Priority Data

Jan. 22, 2016  (JP) ................................ 2016-010904
Jan. 22, 2016  (JP) ................................ 2016-010905

(51) Int. Cl.
*B25J 9/04*    (2006.01)
*B25J 9/06*    (2006.01)
(Continued)

(52) U.S. Cl.
CPC ............. *B25J 9/042* (2013.01); *B25J 9/06* (2013.01); *B25J 11/0095* (2013.01); *B25J 18/04* (2013.01);
(Continued)

(58) Field of Classification Search
CPC ......................................................... B25J 9/042
See application file for complete search history.

(56) References Cited

U.S. PATENT DOCUMENTS 5,178,512 A * 1/1993 Skrobak ................... B25J 9/042
                                                                 414/744.3
10,213,924 B2 * 2/2019 Kitahara ................. B65G 47/90
(Continued)

FOREIGN PATENT DOCUMENTS

JP    2000117670 A     4/2000
JP    2002338042 A  * 11/2002
(Continued)

OTHER PUBLICATIONS

International Search Report corresponding to Application No. PCT/JP2016/071711; dated Sep. 6, 2016, with English translation.

*Primary Examiner* — Gerald McClain
(74) *Attorney, Agent, or Firm* — Cantor Colburn LLP (57) ABSTRACT

An industrial robot may include a plurality of hands structured to mount the transfer objects; an arm comprising a front end side and a base end side, the hands being rotatably joined with the front end side of the arm; and a main body portion to which the base end side of the arm is rotatably joined. The main body portion may include an elevating unit to which the base end side of the arm is rotatably joined on a top surface side thereof, a housing which holds the elevating unit to be raised/lowered and in which at least part of a bottom end of the elevating unit is housed, and an elevating mechanism structured to raise and lower the elevating unit. The elevating mechanism may be accommodated in the housing so as to align with the elevating unit when viewed from a top-bottom direction.

3 Claims, 4 Drawing Sheets

(51) Int. Cl.
*B25J 11/00* (2006.01)
*B25J 18/04* (2006.01)
*H01L 21/677* (2006.01)

(52) U.S. Cl.
CPC .. *H01L 21/67748* (2013.01); *H01L 21/67766* (2013.01)

(56) References Cited

U.S. PATENT DOCUMENTS

| | | | | |
|---|---|---|---|---|
| 2013/0078060 A1* | 3/2013 | Furuichi | ........... | H01L 21/67766 414/225.01 |
| 2016/0136819 A1* | 5/2016 | Kitahara | ................ | B65G 47/90 414/749.1 |
| 2018/0182658 A1* | 6/2018 | Goto | ........................ | B25J 9/042 |

FOREIGN PATENT DOCUMENTS

| | | | | | |
|---|---|---|---|---|---|
| JP | 2002338042 | A | | 11/2002 | |
| JP | 2003526193 | A | | 9/2003 | |
| JP | 2008264980 | A | * | 11/2008 | |
| JP | 2012056033 | A | * | 3/2012 | |
| JP | 2014042049 | A | | 3/2014 | |
| JP | 2014111310 | A | * | 6/2014 | ....... H01L 21/67766 |
| JP | 2014111310 | A | | 6/2014 | |
| JP | 2014229730 | A | | 12/2014 | |
| JP | 2015036185 | A | * | 2/2015 | ............. B65G 47/90 |
| JP | 2015036185 | A | | 2/2015 | |
| JP | 2015036186 | A | | 2/2015 | |
| WO | 9916689 | A1 | | 4/1999 | |

* cited by examiner

INDUSTRIAL ROBOT WITH NOTCH

CROSS REFERENCE TO RELATED APPLICATIONS

This is the U.S. national stage of application No. PCT/JP2016/071711, filed on Jul. 25, 2016. Priority under 35 U.S.C. § 119(a) and 35 U.S.C. § 365(b) is claimed from Japanese Application Nos. 2016-010904, filed on Jan. 22, 2016; and 2016-010905, filed on Jan. 22, 2016; the disclosures of which are incorporated herein by reference. Priority under 35 U.S.C. § 119(e) is claimed from U.S. Provisional Application 62/202,450, filed on Aug. 7, 2015, the disclosure of which is incorporated by reference.

FIELD OF TECHNOLOGY

At least an embodiment of the present invention relates to an industrial robot for transferring objects-to-be-transferred such as semiconductor wafers.

BACKGROUND

Conventionally known is an horizontally articulated robot for transferring semiconductor wafers between a FOUP (Front Open Unified Pod) and a semiconductor processing device (Patent reference 1, for example). A horizontally articulated robot disclosed in Patent reference 1 configures part of an EFEM (Equipment Front End side Module) and is arranged inside an EFEM housing. The EFEM is arranged on the front side of the semiconductor processor while the FOUP is arranged on the front side of the EFEM. The EFEM housing is formed in a rectangular box which has its shorter-length direction in the front-rear direction and its longer-length direction in the left-right direction.

The horizontally articulated robot disclosed in Patent reference 1 is provided with two hands on which semiconductor wafers are to be mounted, an arm to which the two hands are rotatably joined to the front end side thereof, and a main body portion to which the base end side of the arm is rotatably joined. The arm is configured by a first arm portion, of which the base end side is rotatably joined to the main body portion, a second arm portion, of which the base end side is rotatably joined to the front end side of the first arm portion, and a third arm portion, of which the base end side is rotatably joined to the front end side of the second arm portion and to which the hands are rotatably attached to the front end side thereof. The main body portion is provided with a column member, to which the base end side of the arm (that is, the base end side of the first arm portion) is rotatably joined to the top end thereof, a housing which holds the column member to be able to elevate, and an elevating mechanism which raises/lowers the column member. The column member is housed in the housing when lowered. Also, the elevating mechanism is housed inside the housing. Even when the column member is elevated, the bottom portion of the column member is inside the housing.

The housing is formed such that the shape thereof is square when viewed from the top-bottom direction; the front and rear surfaces of the housing are formed to be planar and intersect orthogonally with the front-rear direction; the left and right surfaces of the housing are formed to be planar and intersect orthogonally with the left-right direction. When viewed from the top-bottom direction, the column member is inside the outward form of the housing. When viewed from the top-bottom direction, the column member is in the center position in the left-right direction of the housing.

Also, the column member is on the front side of the housing in the front-rear direction when viewed from the top-bottom direction. In other words, the base end side of the arm joined to the column member is positioned on the front side of the housing.

The horizontally articulated robot disclosed in Patent reference 1 is arranged in the EFEM housing such that the inside front surface of the EFEM housing is adjacent to the front surface of the housing of the horizontally articulated robot. In other words, the horizontally articulated robot is positioned inside the EFEM housing such that the base end side of the arm joined to the column member is adjacent to the inside front surface of the EFEM housing. For this reason, in an semiconductor fabrication system in which the horizontally articulated root is installed, it is possible to prevent the interference between the inside front and rear surfaces of the EFEM housing and the arm while ensuring the lengths of the first arm portion, the second arm portion and the third arm portion.

PATENT REFERENCE

[Patent reference 1] Unexamined Japanese Patent Application 2015-36186 Publication As described above, the horizontally articulated robot disclosed in Patent reference 1 is positioned inside the EFEM housing. Various kinds of piping and cables may be routed inside the EFEM housing. To ensure a space for routing pipes and cables, it is preferred that the main body portion of the horizontally articulated robot be made thinner in the front-rear direction.

Various kinds of pipes or cables may be routed inside the EFEM housing in which the horizontally articulated robot disclosed in Patent reference 1 is installed. However, to prevent the interference between the inside front and rear surfaces of the EFEM housing and the arm while ensuring the lengths of the first arm portion, the second arm portion and the third arm portion, the horizontally articulated robot disclosed in Patent reference 1 is installed inside the EFEM housing such that the inside front surface of the EFEM housing is adjacent to the base end side of the arm of the horizontally articulated robot; thus, the inside front surface of the EFEM housing and the front surface of the housing of the horizontally articulated robot are adjacent to each other. Therefore, it is difficult, in the EFEM housing in which the horizontally articulated robot disclosed in Patent reference 1 is installed, to route pipes and cables along the inside front surface of the EFEM housing; as a result, flexibility in routing pipes and cables is decreased.

SUMMARY

At least an embodiment of the present invention provides an industrial robot in which a main body portion, to which the base end portion of an arm is rotatably joined, can be made thinner.

At least an embodiment of the present invention provides an industrial robot in which flexibility in routing pipes and cables inside an EFEM housing can be increased even when the base end side of the arm is positioned adjacently to the side surface on the inside of the EFEM housing.

To achieve the above, an industrial robot of at least an embodiment of the present invention is provided with hands on which objects-to-be-transferred are to be mounted, an arm, to which the hand is rotatably joined to the front end side thereof, and a main body portion, to which the base end side of the arm is rotatably joined; the main body portion is provided with an elevating unit, to which the base end side of the arm is rotatably joined to the top portion thereof, a housing which holds the elevating unit to be raised and lowered and in which at least part of at the bottom end side of the elevating unit is housed, and an elevating mechanism for raising/lowering the elevating unit; the elevating mechanism is stored in the housing such that it aligns with the elevating unit when viewed from the top-bottom direction.

In at least an embodiment of the present invention, for example, the housing is formed to be in a rectangular shape having the longer direction in the left-right direction and the shorter direction in the front-rear direction when viewed from the top-bottom direction; the elevating unit is formed to be in a rectangular shape having he longer direction in the left-right direction and the shorter direction in the front-rear direction when viewed from the top-bottom direction, and is provided with a frame portion which is housed in the housing when the elevating unit is lowered.

In the industrial robot of at least an embodiment of the present invention, the main body portion is provided with the elevating unit, which the base end side of the arm is rotatably joined to the top portion thereof, the housing, in which at least part of the bottom end side of the elevating unit is housed, and the elevating mechanism for raising/lowering the elevating unit; the elevating mechanism is stored in the housing such that it aligns with the elevating unit when viewed from the top-bottom direction. For this reason, when the housing is formed to be in a rectangular shape having the longer direction in the left-right direction and the shorter direction in the front-rear direction when viewed from the top-bottom direction as in at least an embodiment of the present invention, the width of the housing in the front-rear direction can be reduced, compared to the configuration in which the elevating mechanism is housed in the housing such that it is out of alignment with the elevating unit in the front-rear direction. In other words, compared to the configuration in which the elevating mechanism is stored in the housing while out of alignment with the elevating unit in the front-rear direction, the width of the main body portion in the front-rear direction can be shortened in at least an embodiment of the present invention; as a result, the main body unit can be made thinner.

In at least an embodiment of the present invention, it is preferred that the main body unit be provided with a guide mechanism which has a guide rail and a guide block that engages with the guide rail to guide the elevating unit in the top-bottom direction, and that the guide rail and the guide block be arranged at the both outsides of the frame portion in the left-right direction and housed inside the housing. With this configuration, it is possible to increase the distance between the guide rail and the guide block arranged on the left side of the frame portion and the guide rail and the guide block arranged on the right side of the frame portion. Therefore, it is possible that the elevating unit can smoothly be guided by the guide mechanism.

Means to Achieve Objects

To achieve the above described objective, an industrial robot of at least an embodiment of the present invention is provided with hands on which objects-to-be-transferred are to be mounted, an arm, to which the hand is rotatably joined to the front end side thereof, and a main body portion, to which the base end side of the arm is rotatably joined; the main body portion is provided with an elevating unit, to which the base end side of the arm is rotatably joined to the top portion thereof, a housing which holds the elevating unit to be raised and lowered and in which at least part of the bottom side of the elevating unit is housed; the elevating unit is provided with a protruding portion protruding toward one side of the horizontal direction above the top end thereof, and is rotatably joined to the protruding portion.

In the industrial robot of at least an embodiment of the present invention, the elevating unit has the protruding portion protruding toward one side of the horizontal direction at the top end thereof, and the base end side of the arm is positioned above the top end of the protruding portion and rotatably joined to the protruding portion. For this reason, for example, even when the industrial robot is arranged inside the EFEM housing while the base end side of the arm is adjacent to an inside side surface of the EFEM housing, pipes and cables can be routed along an inside side surface of the EFEM housing by using a space below the protruding portion in at least an embodiment of the present invention. Thus, in at least an embodiment of the present invention, even when the industrial robot is arranged having the base end side of the arm be adjacent to an inside side surface of the EFEM housing, flexibility in routing pipes and cables inside the EFEM housing can be increased in at least an embodiment of the present invention.

In at least an embodiment of the present invention, it is preferred that the elevating unit be provided with a frame portion which is to be housed in the housing when the elevating unit is lowered, and a top side frame portion to which the protruding portion is formed, and that the frame portion and the top side frame portion be formed as separate bodies and fixed to each other. With this configuration, it is possible that multiple different top side frame portions having protruding portions with different protruding amounts can be secured to the common frame portion. Therefore, the protruding amount of the protruding portion of the elevating unit can be changed without changing the entire elevating unit, but by changing the top side frame portion only.

In at least an embodiment of the present invention, the housing is formed to be in a rectangular shape having the longer direction in the left-right direction and the shorter direction in the front-rear direction when viewed from the top-bottom direction; the protruding portion is protruded toward one side in the front-rear direction.

In at least an embodiment of the present invention, it is preferred that the main body unit be provided with an elevating mechanism for raising/lowering the elevating unit, that he elevating unit be provided with a frame portion which is formed to be in a rectangular shape having the longer direction in the left-right direction and the shorter direction in the front-rear direction when viewed from the top-bottom direction, and that the elevating mechanism be housed in the housing such that it aligns with the frame portion when viewed from the top-bottom direction. With this configuration, compared to the configuration in which that the elevating mechanism is stored while shifted from the frame portion in the front-rear direction, the width of the housing in the front-rear direction can be shortened. As a result, the main body unit can be made thinner.

In at least an embodiment of the present invention, it is preferred that the main body unit be provided with a guide mechanism which has a guide rail and a guide block that engages with the guide rail to guide the elevating unit in the top-bottom direction, that the elevating unit be provided with a frame portion which is formed to be in a rectangular shape having the longer direction in the left-right direction and the shorter direction in the front-rear direction and is stored in the housing when the elevating unit is lowered, and that the guide rail and the guide block be arranged at both outsides of the frame portion in the left-right direction and accommodated inside the housing. With this configuration, the distance between the guide rail and the guide block arranged on the left side of the frame portion and the guide rail and the guide block arranged on the right side of the frame portion can be increased. Therefore, the elevating unit can smoothly be guided in the top-bottom direction by the guide mechanism.

As described above, in the industrial robot of at least an embodiment of the present invention, the main body portion to which the base end side of the arm is rotatably joined can be made thinner.

As described above, in at least an embodiment of the present invention, even when the industrial robot is arranged such that the base end side of the arm is placed adjacent to an inside side surface of the EFEM housing, flexibility in routing pipes and cables inside the EFEM housing can be increased.

BRIEF DESCRIPTION OF THE DRAWING

Embodiments will now be described, by way of example only, with reference to the accompanying drawings which are meant to be exemplary, not limiting, and wherein like elements are numbered alike in several Figures, in which.

DETAILED DESCRIPTION

An embodiment of the present invention is described hereinafter referring to the drawings.

Configuration of Industrial Robot

Figure 1A:
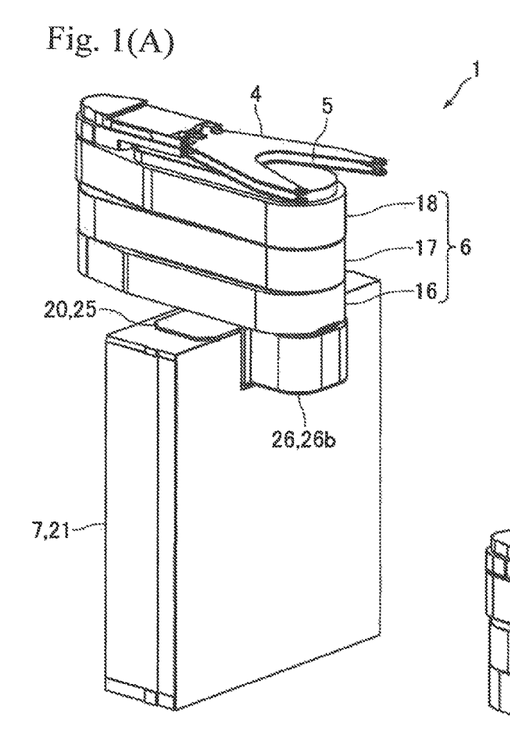
FIGS. 1(A) and 1(B) are perspective views of an industrial robot of an embodiment of the present invention: (A) illustrates that an elevating unit is lowered; (B) illustrates that the elevating unit is raised.
Figure 1B:
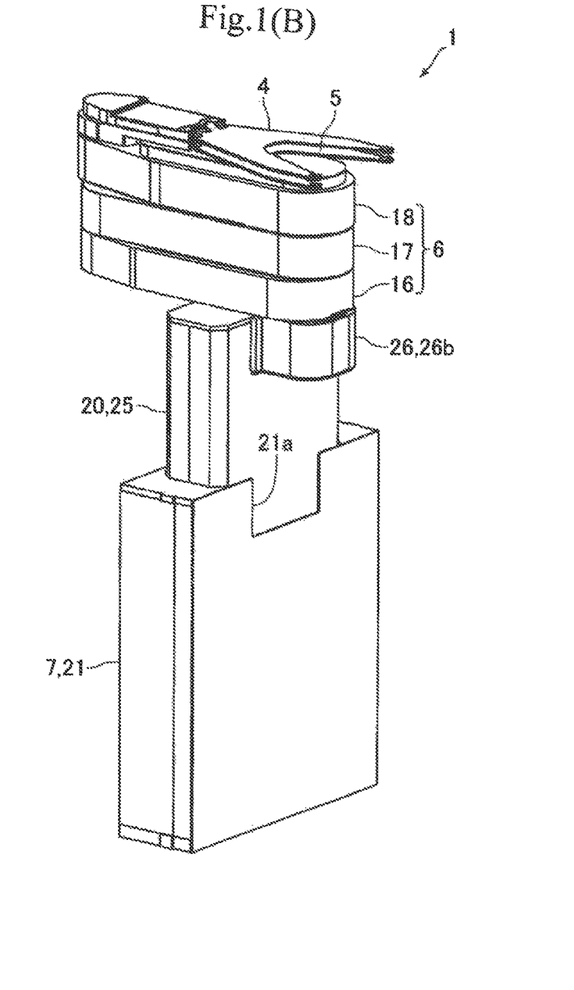
Figure 2:
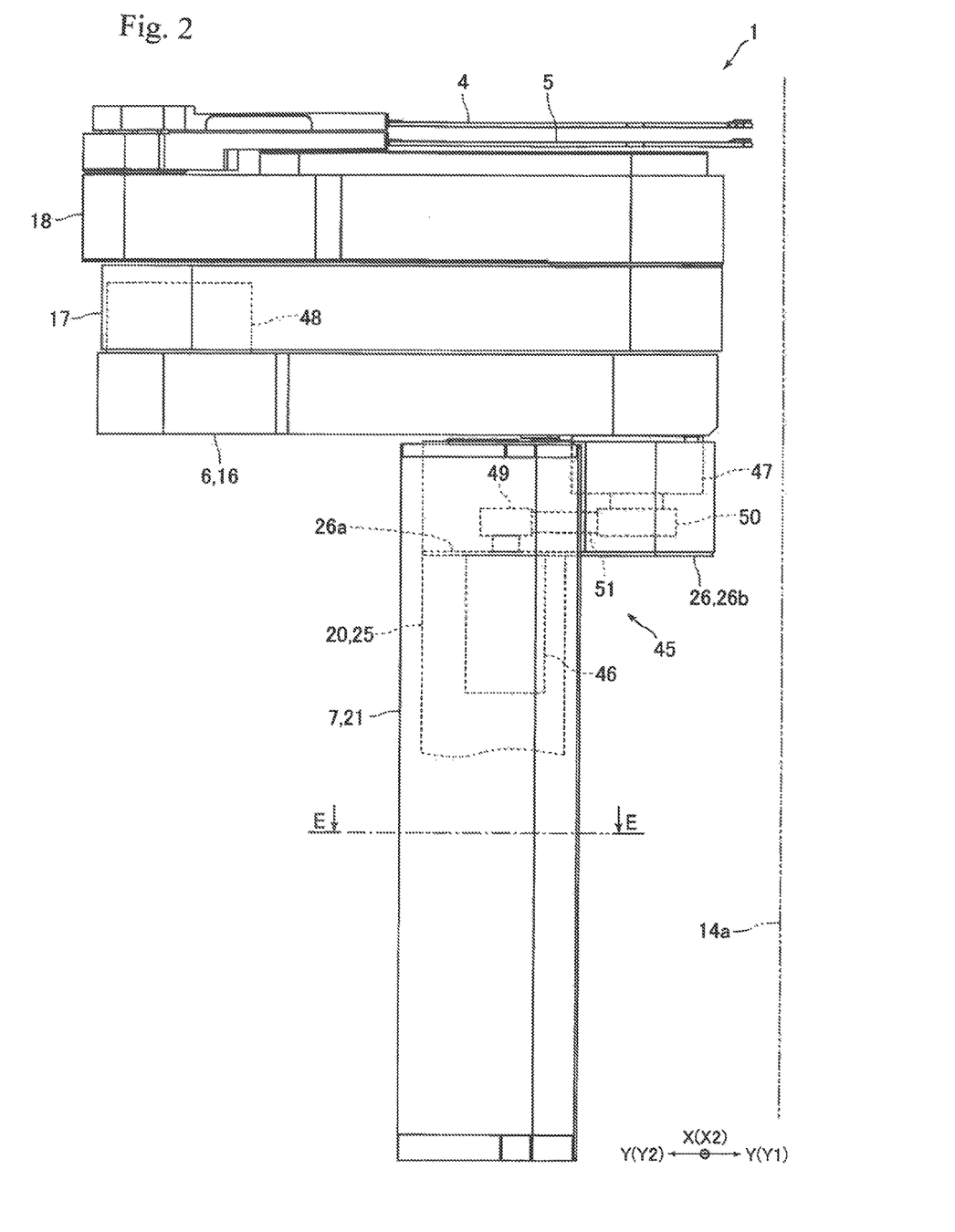
FIG. 2 is a side view of the industrial robot shown in FIG. 1.
Figure 3:
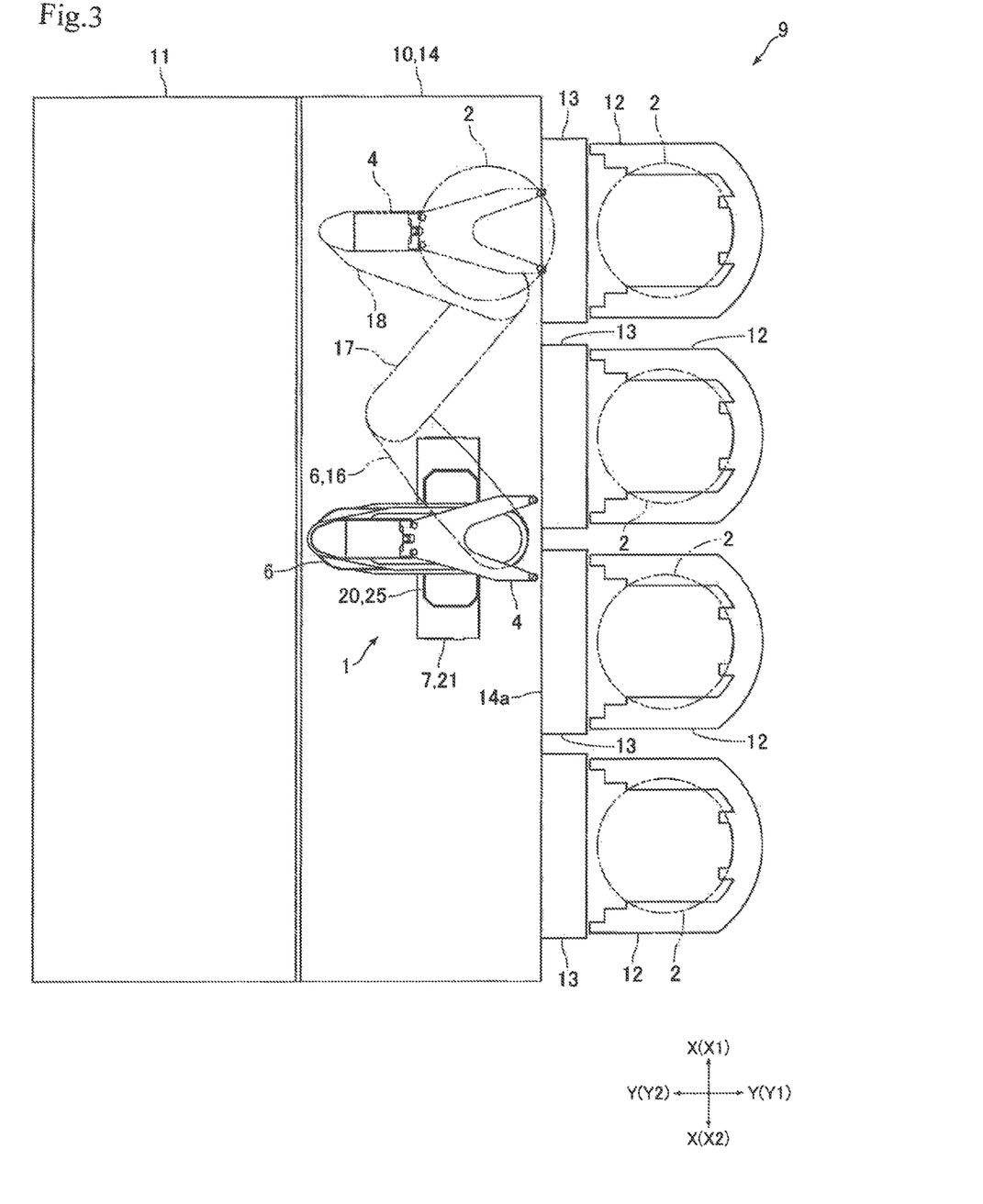
FIG. 3 is a plan view of a semiconductor fabrication system in which the industrial robot shown in FIG. 1 is used.
Figure 4:
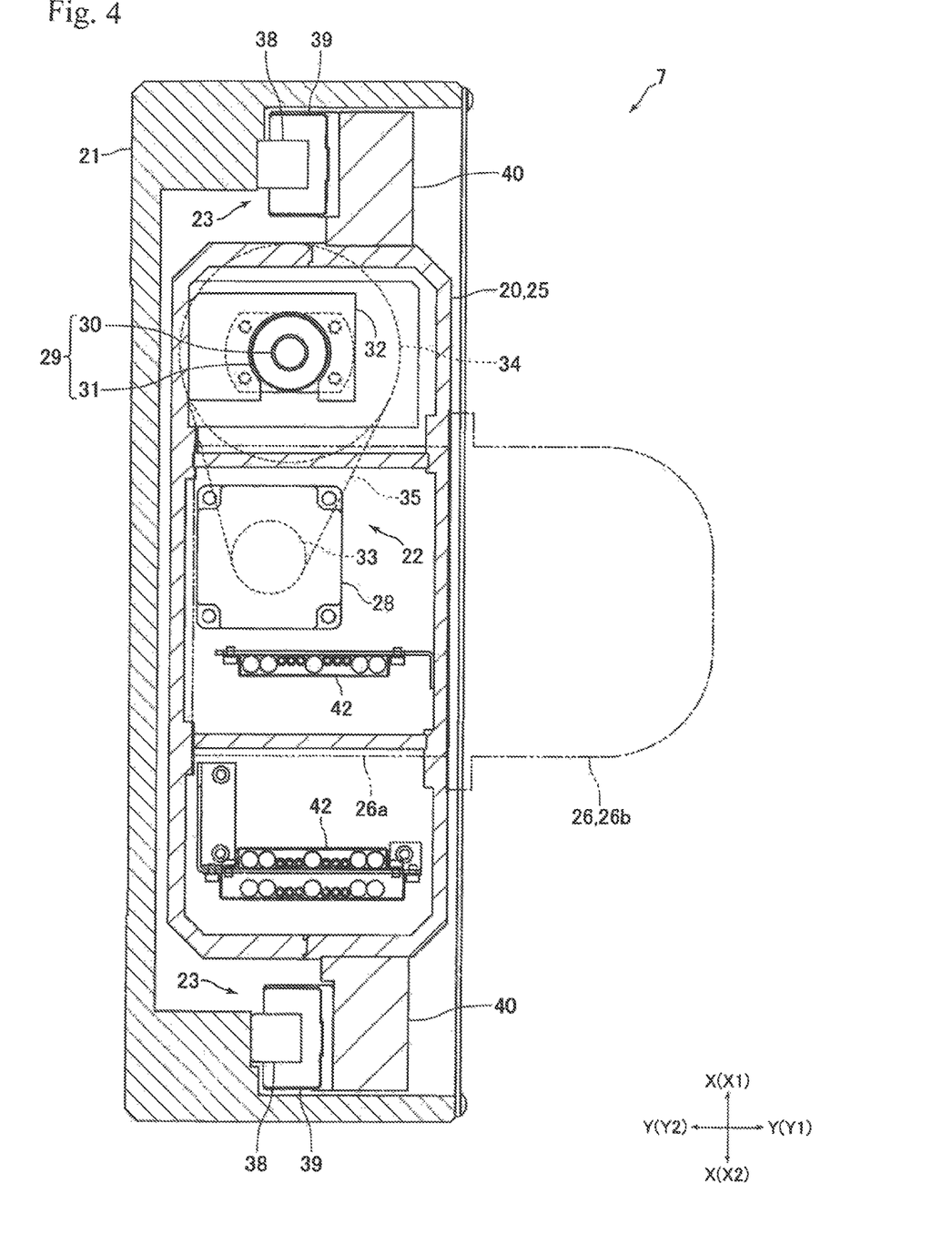
FIG. 4 is a cross-sectional view used to explain the structure by an E-E cross-section of FIG. 2.

FIGS. 1(A) and 1(B) show perspective views of an industrial robot of an embodiment of the present invention: FIG. 1(A) illustrates [the robot] in a state where an elevating unit is lowered; FIG. 1(B) illustrates [the robot] in a state where the elevating unit is raised. FIG. 2 is a side view of the industrial robot shown in FIGS. 1(A) and 1(B). FIG. 3 is a plan view of a semiconductor fabrication system in which the industrial robot shown in FIGS. 1(A) and 1(B) is installed for use. FIG. 4 is a cross-sectional view used to explain the structure of an E-E cross-section of FIG. 2.

An industrial robot 1 of this embodiment is a horizontally articulated robot for transferring semiconductor wafers 2 (referring to FIG. 3) which are objects-to-be-transferred. This industrial robot 1 is provided with two hands 4, 5, on which semiconductor wafers 2 are to be mounted, an arm 6, to which the hands 4 and 5 are rotatably joined to the front end side thereof and moves horizontally, and a main body portion 7 to which the base end side of the arm 6 is rotatably joined. In the description below, the industrial robot 1 is noted as "robot 1" and the semiconductor wafer 2 is "wafer 2". Also, in the description below, the "left-right direction" is the X direction in FIGS. 1(A) and 1(B), etc. which perpendicularly intersects with the top-bottom direction; the "front-rear direction: is the Y direction in FIGS. 1(A) and 1(B), etc. which perpendicularly intersects with the top-bottom direction and the left-right direction; the X1 direction side is the "right" side; the X2 direction side is the "left" side; the Y1 direction side is the "front" side; the Y2 direction side is the "rear" side.

As shown in FIG. 3, the robot 1 is installed in a semiconductor fabrication system 9 for use. The semiconductor fabrication system 9 is equipped with an EFEM 10 and a semiconductor wafer processing device 11 for applying predetermined processing on wafers 2. The EFEM 10 is arranged on the front side of the semiconductor wafer processor 11. The robot 1 is part of the EFEM 10. Also, the EFEM 10 is equipped with multiple load ports 13 to open/close FOUPs 12 and a housing 14 in which the robot 1 is housed. The housing 14 is formed in a rectangular parallelepiped box elongated in the left-right direction. The load ports 13 are arranged on the front side of the housing 14. The robot 1 is placed inside the housing 14 such that the base end side of the arm 6 is positioned adjacent to the inside front surface 14a of the housing 14, and transfers wafers 2 between the FOUPs 12 and the semiconductor wafer processing device 11.

The arm 6 is configured by a first arm portion 16, which is rotatably joined to the main body portion 7 by the base end side thereof, a second arm portion 17, which is rotatably joined to the front end side of the first arm portion 16 by the base end side thereof, and a third arm portion 18, which is rotatably joined to the front end side of the second arm portion 17 by the base end side thereof. The first arm portion 16, the second arm portion 17 and the third arm portion 18 are formed hollow. The main body portion 7, the first arm portion 16, the second arm portion 17 and the third arm portion 18 are arranged in this order from the bottom in the top-bottom direction.

The [two] hands 4, 5 are formed to be in a Y-shape when viewed in the top-bottom direction. The base end portions of the hands 4 and 5 are joined to the front end side of the third arm portion 18. Also, the hands 4 and 5 are arranged to overlap in the top-bottom direction. More specifically described, the hand 4 is positioned at the top while the hand 5 is positioned at the bottom. The hands 4 and 5 are arranged above the third arm portion 18. Note that FIG. 3 omits the illustration of the hand 5.

The main body portion 7 is provided with an elevating unit 20 to which the base end side of the arm 6 is rotatably joined on the top surface side thereof, an housing 21 which holds the elevating unit 20 to be raised/lowered, an elevating mechanism 22 (referring to FIG. 4) for raising/lowering the elevating unit 20 with respect to the housing 21, and a guide mechanism 23 (referring to FIG. 4) for guiding the elevating unit 20 in the top-bottom direction.

The housing 21 is formed in a thin rectangular box shape; the shape of the housing 21 when viewed from the top-bottom direction is rectangular with the longer direction in the left-right direction and the shorter direction in the front-rear direction. More specifically described, the shape of the housing 21 when viewed in the top-bottom direction is rectangular elongated in the left-right direction. The front surface and the rear surface of the housing 21 are planar surfaces intersecting orthogonally with the front-rear direction; the left and right side surfaces of the housing 21 are planar surfaces intersecting orthogonally with the left-right direction. Also, the top surface and the bottom surface of the housing 21 are planar surfaces intersecting orthogonally with the top-bottom direction.

The elevating unit 20 is provided with a frame portion 25 formed to be a thin rectangular parallelepiped and a top side frame portion 26 fixed to the top end side of the frame portion 25. The frame portion 25 and the top side frame portion 26 are formed as separate bodies and secured to each other. More specifically, the frame portion 25 and the top side frame portion 26 are secured to each other by a screw whose illustration is omitted.

The frame portion 25 is formed in a box shape with an open bottom surface; the shape of the frame portion 25 when viewed from the top-bottom direction is a rectangular shape having the long direction in the left-right direction and the short direction in the front-rear direction. More specifically, the shape of the frame portion 25 when viewed from the top-bottom direction is a rectangular shape elongated in the left-right direction. The front surface and the back surface of the frame portion 25 are planar surfaces which orthogonally intersect with the front-rear direction, and the end surface on the left and right sides of the frame portion 25 are planar surfaces which orthogonally intersect with the left-right direction. Also, the top surface of the frame portion 25 is a planar surface which orthogonally intersects with the top-bottom direction.

The top side frame portion 26 are formed in a rectangular parallelepiped shape. The top side frame portion 26 is formed to be in a rectangular shape having the longer direction in the front-rear direction and the shorter direction in the left-right direction when viewed from the top-bottom direction. Also, the top side frame portion 26 is formed hollow. The width of the top side frame portion 26 in the left-right direction is shorter than the width of the frame portion 25 in the left-right direction. The top side frame portion 26 has a portion-to-be fixed 26a which is to be fixed to the frame portion 25. The portion-to-be-fixed 26a is accommodated in a recessed portion created in the center of the top end of the frame portion 25 in the left-right direction.

The top side frame portion 26 also has a protruding portion 26b which is connected with the front edge of the portion-to-be-fixed 26a and protrudes to the front side from the front surface of the frame portion 25. In other words, the elevating unit 20 is provided with the protruding portion 26b, which protrudes to the front side, on the top end thereof and with the top end side frame portion 26 to which the protruding portion 26b is formed. The base end side of the arm 6 is arranged on the top surface side of the protruding portion 26b and rotatably connected with the protruding portion 26b. In other words, the base end side of the first arm portion 16 is arranged on the top end side of the protruding portion 26b and rotatably connected with the protruding portion 26b.

When the elevating unit 20 is lowered, the frame portion 25 is accommodated in the housing 21. More specifically described, when the elevating unit 20 is lowered to the lowest position (that is, in the condition shown in FIG. 1(A)), the frame portion 25 is entirely housed in the housing 21. In other words, when the elevating unit 20 is at the lowest position, most of the elevating unit 20, except the protruding portion 26b, is accommodated in the housing 21. Also, when the elevating unit 20 is elevated from the lowest position (that is, in the condition shown in FIG. 1(B)), the bottom portion of the frame portion 25 remains in the housing 21. In the top end of the front surface of the housing 21, a notch portion 21a (referring to FIG. 1(B)) is formed so that the protruding portion 26b is to be positioned when the elevating unit 20 is lowered. Note that a notch portion is formed in the top surface of the housing 21 for the frame portion 25 to pass through when the elevating unit 20 is raised or lowered.

The elevating mechanism 22 is housed in the housing 21. The elevating mechanism 22 is provided with a motor 28 and a ball screw 29, as shown in FIG. 4. The ball screw 29 has a screw shaft 30 which is to be driven by the force of the motor 28 and a nut 31 which engages with the screw shaft 30. The motor 28 is housed in the housing 21 and secured to the bottom side of the housing 21. Also, the motor 28 is positioned in the center of the housing 21 in the left-right direction. The screw shaft 30 is arranged such that the axial direction thereof coincides with the top-bottom direction. The screw shaft 30 is positioned on the right side of the motor 28. The screw shaft 30 is rotatably held by the housing 21.

The nut 31 is secured to a nut holding member 32. The nut holding member 32 is fixed inside the frame portion 25. In other words, the nut 31 is fixed inside the frame portion 25 via the nut holding member 32. A pulley 33 is secured to the output shaft of the motor 28, and a pulley 34 is secured to the bottom side of the screw shaft 30. A belt 35 is hung around the pulley 33 and the pulley 34. As shown in FIG. 4, the elevating mechanism 22 is housed in the housing 21 so as to align with the elevating unit 20 when viewed from the top-bottom direction. More specifically described, the elevating mechanism 22 is housed in the housing 21 so as to align with the frame portion 25.

The guide mechanism 23 is provided with a guide rail 38 and a guide block 39 which engages with the guide rail 38. The guide rail 38 is fixed inside the housing 21 such that the longer direction thereof aligns with the top-bottom direction. Also, the guide rail 38 is fixed to the left and right ends on the inside of the housing 21. The guide block 39 is fixed to a block holding member 40. The block holding member 40 is secured to the left and right side surfaces of the frame portion 25. In other words, the guide block 39 is secured to the left and right side surfaces of the frame portion 25 via the block holding member 40, and the guide rail 38 and the guide block 39 are arranged at the left and right sides on the outside of the frame portion 25. Also, the guide rail 38 and the guide block 39 are housed in the housing 21.

In this embodiment, when the motor 28 rotates, the elevating unit 20 moves up and down with respect to the housing 21 while guided by the guide mechanism 23. Note that one end of a cableveyor (registered trade mark) 42 is secured inside the frame portion 25, and the other end of the cableveyor (registered trade mark) 42 is secured inside the housing 21. The cableveyor (registered trade mark) 42 is positioned on the left side of the motor 28.

The robot 1 is also provided with an arm portion driving mechanism 45 (referring to FIG. 2) which rotates the first arm portion 16 and the second arm portion 17 to extend/retract part of the arm 6 which is configured by the first arm portion 16 and the second arm portion 17, a third arm portion driving mechanism (illustration omitted) for rotating the third arm portion 18, a hand driving mechanism (illustration omitted) for rotating the hand 4, and a hand driving mechanism (illustration omitted) for rotating the hand 5.

As shown in FIG. 2, the arm driving mechanism 45 has a motor 46, a reduction gear 47 which reduces the force of the motor 46 and transmits it to the first arm portion 16, and a reduction gear 48 which reduces the force of the motor 46 and transmits it to the second arm portion 17. The motor 46 is fixed to the bottom surface of the portion-to-be-fixed 26a of the top end side frame portion 26. More specifically, the motor 46 is fixed on the bottom surface of the portion-tobe-fixed 26a such that the output shaft thereof is positioned inside the portion-to-be-fixed 26a and the main body portion of the motor 46 is positioned inside the frame portion 25.

The reduction gear 47 configures a joint portion which connects the first arm portion 16 and the protruding portion 26b. This reduction gear 47 is a hollow reduction gear. The case body of the reduction gear 47 is secured inside the protruding portion 26b. The top surface of the output shaft of the reduction gear 47 is fixed to the bottom surface on the base end side of the first arm portion 16. The reduction gear 47, except a top portion of the output shaft which is fixed to the bottom surface of the base end side of the first arm portion 16, is housed inside the protruding portion 26b. The motor 46 and the reduction gear 47 are connected with each other via the pulley 49, which is fixed to the output shaft of the motor 46, a pulley 50, which is fixed to the input shaft of the reduction gear 47, and a belt 51 which is hung around the pulley 49 and the pulley 50. The pulleys 49 and 50 and the belt 51 are housed inside the top side frame portion 26.

The reduction gear 48 configures a joint portion that connects the first arm portion 16 and the second arm portion 17. The reduction gear 48 is a hollow reduction gear, like the reduction gear 47. The motor 46 and the reduction gear 48 are connected with one another via the pulleys 49 and 50, the belt 51, and a pulley, belt, etc. arranged inside the first arm portion 16.

A third arm portion driving mechanism has a motor and a reduction gear which reduces the force of the motor and transmits it to the third arm portion 18. The motor of the third arm portion driving mechanism is arranged inside the second arm portion 17; the reduction gear of the third arm portion driving mechanism configures a joint portion that connects the second arm portion 17 and the third arm portion 18. A hand driving mechanism has a motor and a reduction gear which reduces the force of the motor and transmits it to the hands 4 and 5. The motor and the reduction gear of the hand driving mechanism are arranged inside the third arm portion 18. The reduction gear of the hand driving mechanism and the hands 4 and 5 are connected with one another via a pulley and a belt which are omitted in the figures.

Major Effects of This Embodiment

In this embodiment, as described above, the elevating mechanism 22 is accommodated in the housing 21 such that it aligns with the frame portion 25 in the housing 21 when viewed in the top-bottom direction. Therefore, compared to the configuration in which the elevating mechanism 22 is housed in the housing 21 while shifted from the frame portion in the front-rear direction, the width of the housing 21 in the front-rear direction can be shortened in this embodiment. In other words, compared to the configuration in which the elevating mechanism 22 is housed in the housing 21 while shifted from the frame portion in the front-rear direction, the width of the main body portion 7 in the front-rear direction can be shortened in this embodiment; as a result, the main body portion 7 can be made thinner.

In this embodiment, the frame portion 25 is formed to be in a rectangular shape elongated in the left-right direction when viewed from the top-bottom direction; the guide rail 38 and the guide block 39 are arranged on the outsides of the frame portion 25 in the left-right direction. Therefore, it is possible in this embodiment to increase the distance between the guide rail 38 and the guide block 39 which are positioned on the left side of the frame portion 25 and the guide rail 38 and the guide block 39 which are positioned on the right side of the frame portion 25. Therefore, the elevating unit 20 can smoothly be guided in the top-bottom direction by the guide rail 38 and the guide block 39.

In this embodiment, as described above, the elevating unit 20 has the protruding portion 26b, which protrudes to the front side, on the top side thereof; the base end side of the arm 6 is rotatably connected to the protruding portion 26b. Therefore, even when the robot 1 is arranged inside the housing 14 such that the base end side of the arm 6 is positioned adjacent to the inside front surface 14a of the housing 14 of the EFEM 10 as shown in FIG. 3, pipes and cables to be routed inside the housing 14 can be routed along the front surface 14a of the housing 14 by using a space at the bottom of the protruding portion 26b (see FIG. 2). Therefore, in this embodiment, even when the robot 1 is arranged inside the housing 14 such that the base end side of the arm 6 is positioned adjacent to the front surface 14a of the housing 14, flexibility in routing pipes and cables inside the housing 14 can be increased.

In this embodiment, the frame portion 25 and the top side frame portion 26 are formed as separate bodies and fixed to each other. Therefore, in this embodiment, multiple top side frame portions 26, each of which has the protruding portion 26b with the protruding mount can be fixed to the single frame portion 25. Therefore, in this embodiment, the elevating unit 20 does not have to be replaced entirely, but [only] the top side frame portion 26 and the belt 51 are replaced to change the protruding amount of the protruding portion 26b.

In this embodiment, the elevating mechanism 22 is accommodated in the housing 21 so as to align with the frame portion 25, which is accommodated in the housing 21, when viewed from the top-bottom direction. Therefore, compared to the configuration in which the elevating mechanism 22 is housed in the housing 21 while shifted from the frame portion 25 in the front-rear direction, the width of the housing 21 in the front-rear direction can be shortened in this embodiment; as a result, the main body portion 7 can be made thinner.

In this embodiment, the frame portion 25 is formed to be in a rectangular shape elongated in the left-right direction when viewed from the top-bottom direction; the guide rail 38 and the guide block 39 are arranged on the left and right sides of the frame portion 25. Therefore, in this embodiment, the distance between the guide rail 38 and the guide block 39 which are arranged on the left side of the frame portion 25 and the guide rail 38 and the guide block 39 arranged on the right side of the frame portion 25 can be increased. Therefore, the elevating unit 20 can smoothly be guided in the up-down direction by the guide rail 38 and the guide block 39 in this embodiment.

Other Embodiments

The above-descried embodiment is an example of a preferred embodiment of the present invention; however, it is not limited to this, but can be varyingly modified within the scope of the invention.

In the above-described embodiment, the protruding portion 26b protrudes to the front side from the front surface of the frame portion 25; however, the protruding portion 26b may protrude to the back from the rear surface of the frame portion 25. In this case, the robot 1 is positioned inside the housing 14 such that the base end side of the arm 6 is adjacent to the inside rear surface of the housing 14 of the EFEM 10. In the above-described embodiment, also, the housing 21 and the frame portion 25 are formed to be in a rectangular shape elongated in the left-right direction when viewed from the top-bottom direction; however, the housing 21 and the frame portion 25 may be formed to be in a polygonal shape other than a square or quadrangle shape, or a circular shape when viewed from the top-bottom direction.

In the above-described embodiment, the frame portion 25 and the top side frame portion 26 are formed as separate bodies and fixed to each other; however, the frame portion 25 and the top side frame portion 26 may be formed as a single unit. In other words, the protruding portion 26b may be formed directly to the frame portion 25. Also, in the above-described embodiment, the elevating mechanism 22 is housed in the housing 21 so as to align with the frame portion 25 housed in the housing 21 when viewed from the top-bottom direction; however, the elevating mechanism 22 may be housed in the housing 21 while shifted from the frame portion 25 in the front-rear direction or may be housed in the housing 21 while shifted from the frame portion 25 in the left-right direction.

In the above-described embodiment, the frame portion 25 is entirely housed in the housing 21 when the elevating unit 20 is lowered to the lowest position; however, the top end portion of the frame portion 25 may protrude toward the top from the top surface of the housing 21 when the elevating unit 20 is lowered at the lowest position. Also, in the above-described embodiment, the elevating unit 20 has the protruding portion 26b, which protrudes to the front side; however, the elevating unit 20 may not have the protruding portion 26b. Also, the robot 1 of the above-described embodiment may be provided with an elevating mechanism for raising/lowering the main body portion 7 (more specifically, for raising/lowering the housing 21). In other words, the robot 1 may be provided with the same elevating mechanism as the elevating mechanism disclosed in Unexamined Japanese Patent Application 2015-36185 Publication.

In the above-described embodiment, the two hands 4 and 5 are attached to the front end side of the third arm portion 18; however, [only] one hand may be attached to the front end side of the third arm portion 18. Also, in the above-described embodiment, the arm 6 is configured by three arm portions: the first arm portion 16, the second arm portion 17 and the third arm portion 18; however, the arm 6 may be configured by two arm portions or four or more arm portions. In the above-described embodiment, the robot 1 is a robot for transferring wafers 2; however, the robot 1 may be a robot for transferring objects-to-be-transferred such as liquid crystal glass substrates.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An industrial robot for use with transfer objects, the industrial robot comprising:
    a plurality of hands structured to mount the transfer objects;
    an arm comprising a front end side and a base end side, the hands being rotatably joined with the front end side of the arm; and
    a main body portion to which the base end side of the arm is rotatably joined;
    wherein the main body portion comprises an elevating unit to which the base end side of the arm is rotatably joined on a top surface side thereof, a housing which holds the elevating unit to be raised/lowered and in which at least part of a bottom end of the elevating unit is housed, and an elevating mechanism structured to raise and lower the elevating unit;
    the elevating unit comprises a protruding portion, which protrudes toward one side in the horizontal direction, on a top end thereof;
    the base end side of the arm is arranged on a top surface side of the protruding portion and rotatably joined with the protruding portion;
    the elevating unit comprises a frame portion, housed in the housing when the elevating unit is lowered, and a top side frame portion on which the protruding portion is formed;
    the frame portion and the top side frame portion are formed as separate bodies and fixed to each other;
    the housing has in a rectangular shape having a longer dimension in the left-right direction and a shorter dimension in the front-rear direction when viewed in a top-bottom direction;
    the protruding portion protrudes toward one side in the front-rear direction; and
    a notch is provided in the housing longer dimension into which the protruding portion is positioned when the elevating unit is lowered.

2. The industrial robot as set forth in claim 1 wherein the elevating unit is provided with a frame portion which is formed to be in a rectangular shape having a longer dimension in the left-right direction and a shorter dimension in the front-rear direction when viewed from the top-bottom direction; and
    the elevating mechanism is housed in the housing so as to align with the frame portion when viewed from the top-bottom direction.

3. The industrial robot as set forth in claim 1 wherein the main body portion comprises a guide mechanism comprising has a guide rail and a guide block engaged with the guide and structured to guide the elevating unit in the top-bottom direction;
    the elevating unit is provided with a frame portion which is formed to be in a rectangular shape having a longer dimension in the left-right direction and a shorter direction in the front-rear dimension when viewed from the top-bottom direction and is to be housed in the housing when the elevating unit is lowered; and
    the guide rail and the guide block are arranged at the left and right sides of the frame portion and housed inside the housing.

* * * * *